United States Patent [19]

Baba

[11] Patent Number: 4,578,780

[45] Date of Patent: Mar. 25, 1986

[54] DUAL PORT TYPE SEMICONDUCTOR MEMORY

[75] Inventor: Fumio Baba, Kawasaki, Japan

[73] Assignee: Fujitsu Limited, Kawasaki, Japan

[21] Appl. No.: 536,321

[22] Filed: Sep. 27, 1983

[30] Foreign Application Priority Data

Sep. 30, 1982 [JP] Japan ................................ 57-169551

[51] Int. Cl.[4] .............................................. G11C 7/00
[52] U.S. Cl. .................................... 365/190; 365/149
[58] Field of Search ............... 365/149, 189, 190, 154, 365/202

[56] References Cited

U.S. PATENT DOCUMENTS 4,045,783 8/1977 Harland ................................ 365/149

FOREIGN PATENT DOCUMENTS 55-157194 12/1980 Japan .................................... 365/190

Primary Examiner—Joseph A. Popek
Attorney, Agent, or Firm—Staas & Halsey

[57] ABSTRACT

A dual port type semiconductor memory using a dynamic type random access memory (RAM) includes; a plurality of word lines, a plurality of pairs of bit lines, and a dynamic type RAM connected at each intersection of the word lines and the bit lines. The semiconductor memory further includes a first column decoder connected to a writing-reading out bus through a pair of gates ($G_1$) including two transistors directly connected to each of the bit lines, and a second column decoder connected to a reading out bus through a pair of gates ($G_2$) including four transistors. Gates of two of the four transistors of the second pair of gates are connected to each bit line. The other two of the four transistors are connected to the reading out bus.

9 Claims, 3 Drawing Figures

DUAL PORT TYPE SEMICONDUCTOR MEMORY

BACKGROUND OF THE INVENTION

(1) Field of the Invention

The present invention relates to a semiconductor memory, more particularly, to a dual port type semiconductor memory using a dynamic type random access memory (RAM) advantageously in a memory of a computer system.

(2) Description of the Prior Art

Recent research and development in the field of semiconductor memories have concentrated on the achievement of greater miniaturization and integration. Few studies, however, have been made on the achievement of greater efficiency of utilization of semiconductor memories.

One well-known technique for achieving greater efficiency of utilization of semiconductor memories is the use of a dual port type semiconductor memory using a static type RAM.

A static type RAM has the feature of "non-destructive read out". That is to say, even if data is read out from a memory cell, the data stored in the memory cell is not erased. Since the static type RAM has the feature as mentioned above, it is possible to simultaneously read out two data from the same memory cell.

A static type RAM, however, has many elements compared with a dynamic type RAM, usually six as opposed to two. Therefore, a static type RAM is disadvantageous in miniaturizing memories and increasing therefore their integration.

In this sense, a dynamic type RAM is advantageous. However, no dynamic type RAM having a single transistor memory cell offers "non-destructive read out". This means that once data is read out from a memory cell, the data in the memory cell is erased. No dual port type semiconductor memory using a dynamic type RAM has therefore been realized up to now.

SUMMARY OF THE INVENTION

The primary object of the present invention is to provide a dual port type semiconductor memory using a dynamic type RAM.

Another object of the present invention is to provide a dual port type semiconductor memory using the dynamic type RAM enabling a high efficiency of utilization.

Still another object of the present invention is to provide a dual port type semiconductor memory using the dynamic type RAM featuring high miniaturization and integration.

In accordance with the present invention, there is provided a dual port type semiconductor memory using a dynamic type RAM, comprising a plurality of word lines, a plurality of pairs of bit lines, a plurality of dynamic memory cells of a single transistor type, connected at each intersection of the word lines and bit lines, a first column decoder connected to a writing-reading out bus through a pair of gates ($G_1$) including two transistors directly connected to each bit line, and a second column decoder connected to a reading out bus through a pair of gates ($G_2$) including four transistors, gates of two of the four transistors being connected to each bit line and the other two of the four transistors being connected to the reading out bus.

In accordance with the structure of the present invention, it is possible to use a dynamic type RAM as a dual port type semiconductor memory, which is advantageous in miniaturizing the device and increasing the integration of the dual port type semiconductor memory.

DESCRIPTION OF THE PREFERRED EMBODIMENTS

Before describing the preferred embodiments, an explanation will be given for a conventional dual port type semiconductor memory using a static type RAM for reference.

Figure 1:
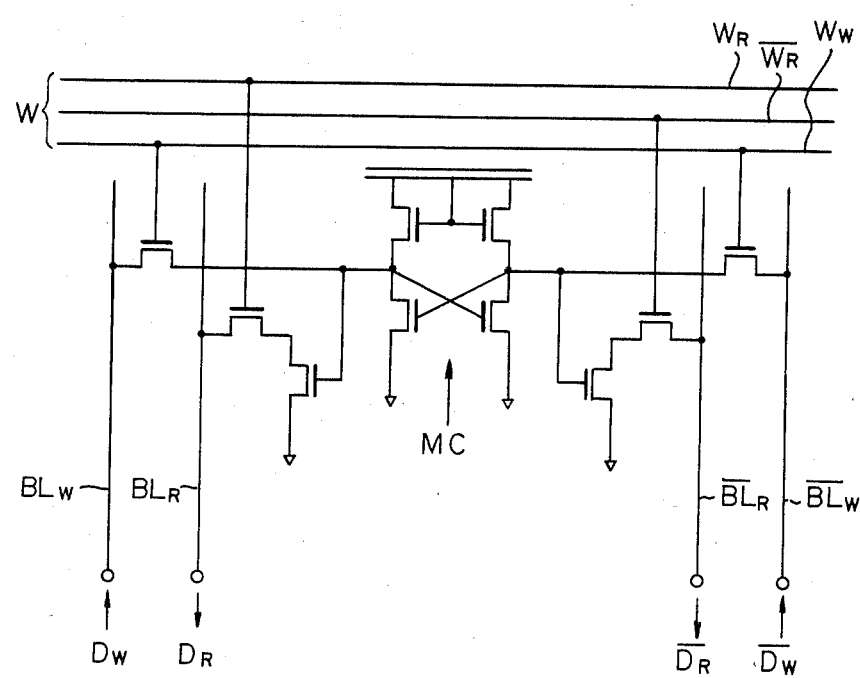
FIG. 1 is a basic circuit diagram of a portion of a conventional dual port type semiconductor memory using a static type RAM.

Referring to FIG. 1, MC represents a memory cell formed by a static type RAM in the form of a flip-flop circuit. The memory cell MC is connected of the intersections between word lines W, consisting of lines $W_R$, $\overline{W_R}$, and $W_W$, and two pairs of bit lines $BL_W$, $BL_R$ and $\overline{BL_R}$, $\overline{BL_W}$.

In writing into the memory cell MC, the word line $W_W$ and the bit lines $BL_W$, $\overline{BL_W}$ are selected and writing data $D_W$, $\overline{D_W}$ are applied to the memory cell MC by commands transmitted from a central processing unit (CPU, not shown).

In reading out from the memory cell MC, the word line $W_R$ and the bit line $BL_R$ are selected and the read-out data $D_R$ is obtained from the memory cell MC by commands transmitted from the CPU through an address line (not shown).

If the memory cell MC is accessed during the above-mentioned reading out process by commands transmitted from the CPU through another address line (not shown), the word line $\overline{W_R}$ and the bit line $\overline{BL_R}$ are selected and inverted reading out data $\overline{D_R}$ is obtained from the memory cell MC. The dual port type semiconductor memory using the static type RAM can be accessed simultaneously by means of the above-mentioned writing and reading out process. As a result, the efficiency of utilization for the semiconductor memory is increased.

A dual port type semiconductor memory using a dynamic type RAM according to an embodiment of the present invention will now be described.

Figure 2:
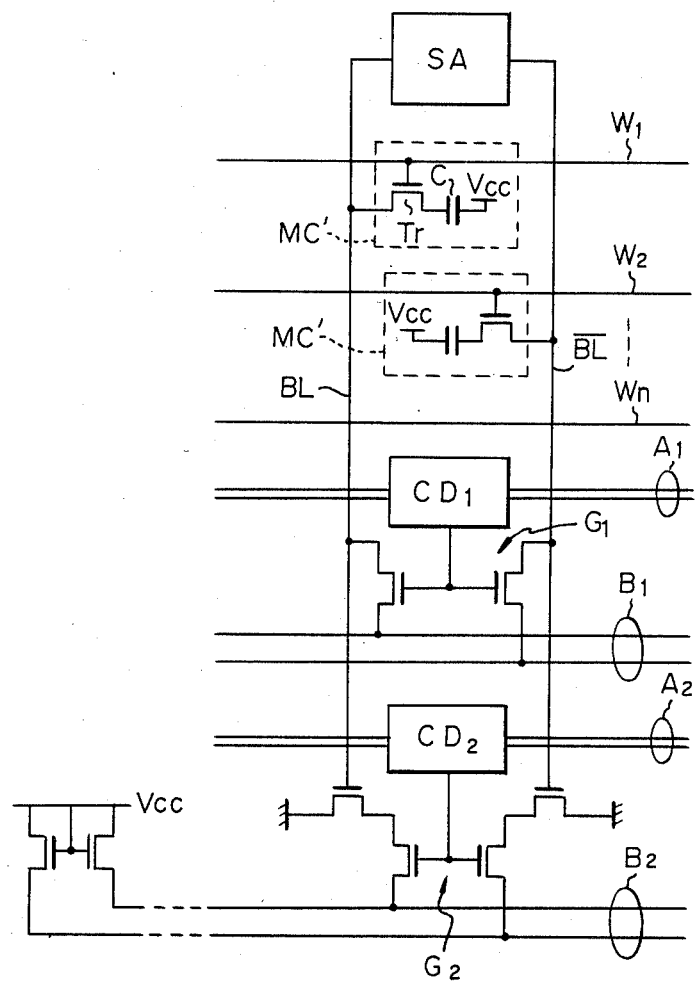
FIG. 2 is a basic circuit diagram of a portion of a dual port type semiconductor memory using a dynamic type RAM according to an embodiment of the present invention.

Referring to FIG. 2, a plurality of word lines are shown by the reference letters $W_1$, $W_2$ - - - $W_n$. A pair of bit lines is shown by the reference letters BL and $\overline{BL}$. A plurality of single transistor type dynamic memory cell are shown by the same reference letters MC'. Each of the memory cells MC' is connected between each intersection of the word lines and bit lines, as shown in the drawing. Each of the memory cells MC' consists of a transistor Tr, a capacitor C, and voltage source $V_{CC}$.

To use the capacitor C to store data, the data is rewritten periodically to prevent it from being extinguished by unavoidable discharge in what is generally called a "refresh" operation. The refresh operation can be performed by a sense amplifier SA. The sense amplifier SA usually comprises a flip-flop circuit and can apply the refreshed data to the memory cell MC' before the data stored in the capacitor C of the memory cell MC' is extinguished. Accordingly, the sense amplifier SA can store data for a short term. Therefore, the sense amplifier SA has the function of "non-destructive read out" as well as the feature of the static type RAM as mentioned above. Moreover, the sense amplifier SA can function to hold the data to all memory cells MC' connected to the sense amplifier SA in the case of both writing and reading of the data.

The dual port type semiconductor memory using a dynamic type RAM according to the present invention, moreover, comprises at least two column decoders ($CD_1$, $CD_2$). A first column decoder $CD_1$ is connected to the writing-reading out bus $B_1$ through a pair of gates $G_1$. A second column decoder $CD_2$ is connected to the reading out bus $B_2$ through a pair of gates $G_2$. Assuming that the CPU requests simultaneously read out of the data D from the upper memory cell MC' and the data D' from the lower memory cell MC' through different address routes (not shown), the first column decoder $CD_1$ is selected through a column address bus $A_1$ for one address route, and the second column decoder $CD_2$ is selected through a column address bus $A_2$ for the other address route.

Consequently, the desired data is applied to the CPU through each of the address routes.

The first column decoder $CD_1$ can write the data into the memory cell MC' because a pair of gates $G_1$ is directly connected between the bit lines BL, $\overline{BL}$ and the writing-reading out bus $B_1$, not through a gate of the transistor. Accordingly, the writing operation can be performed only through the first column decoder $CD_1$.

When the data is written into one of the memory cells MC' at the optional word line $W_n$, and at the same time, if the CPU requests to read out data from another memory cell MC' (not shown), selection of the memory cell and reading out of the data from it can be performed by another column decoder (not shown). Since a pair of gates $G_2$ is controlled by the second column decoder $CD_2$ and is connected to the bit lines BL, $\overline{BL}$ through the gates of two transistors, the data on the bit lines are not affected by the action of a pair of gates $G_2$. Namely, when the data is read out from the memory cell through a pair of gates $G_2$, the data on the bit lines are not destroyed due to the influence of the reading out bus $B_2$. Meanwhile, since a pair of gates $G_1$ is controlled by the first column decoder $CD_1$, which is directly connected to the bit lines BL, $\overline{BL}$ through a drain and a source of two transistors not through the gate as mentioned above, the data on the bit lines are affected by the writing-reading out bus $B_1$. In order to prevent the influence from bus $B_1$, when the data is read out from the memory cell through the first column decoder $CD_1$, the memory cell is refreshed by an external amplifier (WA, shown in FIG. 3) connected to the bus $B_1$ as well as by the conventional external amplifier at the dynamic type RAM.

Figure 3:
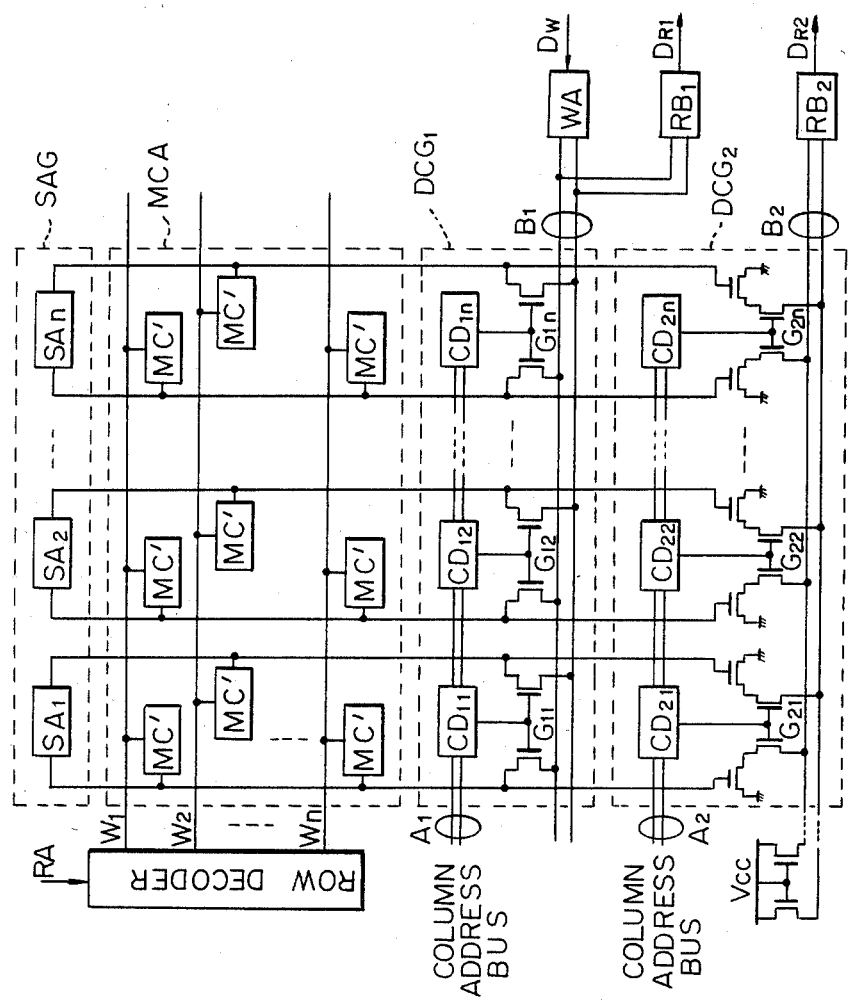
FIG. 3 is a block diagram of the overall structure of a dual port type semiconductor memory using a dynamic type RAM according to an embodiment of the present invention.

FIG. 3 is a block diagram of the overall structure of a dual port type semiconductor memory using a dynamic type RAM according to the present invention. Referring to FIG. 3, reference letter SAG shows a group of the sense amplifiers ($SA_1$ to $SA_n$), and MCA shows a group of the memory cells MC', i.e., a memory cell array. Reference letter $DCG_1$ shows a group of first column decoders $CD_1$ including a pair of gates ($G_{11}$ to $G_{1n}$), and $DCG_2$ shows a group of second column decoders $CD_2$ including a pair of gates ($G_{21}$ to $G_{2n}$). A row decoder RD can select one of the word lines ($W_1$, $W_2$ - - - $W_n$) based on a row address command transmitted from the CPU. One of the first column decoders ($CD_{11}$ to $CD_{1n}$) in the $DCG_1$ is selected by a column address command transmitted from the CPU through a column address bus $A_1$. Similarly, the second column decoder ($CD_{21}$ to $CD_{2n}$) in the $DCG_2$ is selected through a column address bus $A_2$. The read out data from the $DCG_1$ is applied to a first reading out buffer amplifier $RB_1$ through the bus $B_1$. The read out data $D_{R1}$ is obtained from the output of the buffer $RB_1$. Since the first column decoder has the function of writing as mentioned above, the writing data $D_W$ is applied to the bus $B_1$ through a writing amplifier WA. Meanwhile, the read out data from the $DCG_2$ is applied to a second reading out buffer amplifier $RB_2$ through the bus $B_2$. The read out data $D_{R2}$ is obtained from the output of the buffer $RB_2$.

I claim:

1. A dual port type semiconductor memory using a dynamic type random access memory (RAM) and including a writing-reading out bus and a reading out bus, comprising:
    a plurality of word lines;
    a plurality of pairs of bit lines intersecting said word lines;
    a plurality of dynamic memory cells respectively connected at the intersections of said word lines and one of the bit lines in each of said pairs of bit lines;
    first selection means, operatively connected between the writing-reading out bus and said pairs of bit lines, for selectively transferring data between the writing-reading out bus and selected ones of said pairs of bit lines; and
    second selection means, operatively connected between the reading out bus and said pairs of bit lines, for selectively transferring data from selected ones of said pairs of bit lines to the reading out bus.

2. A dual port type semiconductor memory using a dynamic type RAM as claimed in claim 1, wherein said first selection means includes a plurality of first column decoders and a plurality of first transfer gate means, and wherein said second selection means includes a plurality of second column decoders and a plurality of second transfer gate means.

3. A dual part type semiconductor memory using a dynamic type RAM as claimed in claim 2,
    wherein said first transfer gate means include two transistors directly connected to said respective pairs of bit lines, wherein said first column decoders are respectively connected to the gates of said first transfer gate means, wherein said second transfer gate means include four transistors, gates of two of said four transistors being respectively connected to said pairs of bit lines and the other two of said four transistors being connected to the reading out bus, and wherein said second column decoders are respectively connected to the gates of said second transfer gate means.

4. A dual port type semiconductor memory using a dynamic type RAM as claimed in claim 2, further comprising a first column address bus operatively connected to said first column decoders.

5. A dual port type semiconductor memory using a dynamic type RAM as claimed in claim 2, further comprising a second column address bus operatively connected to said second column decoders.

6. A dual port type semiconductor memory employing a dynamic type RAM as claimed in claim 2,
  wherein each of said transfer gate means includes a pair of transistors directly connected to said respective pairs of bit lines, said first column decoders being respectively connected to the gates of said pair of transistors; and
  wherein each of said second transfer gate means includes two pairs of transistors, gates of one pair of said transistors being respectively connected to said pairs of bit lines and the other pair of said transistors being connected to the reading out bus, said second column decoders being respectively connected to the gates of the other pair of said transistors.

7. A dual port type semiconductor memory including a dynamic random access memory, comprising:
  word lines;
  pairs of bit lines intersecting said word lines;
  dynamic memory cells respectively, operatively connected at the intersections of said word lines and one of the bit lines of each of said pairs of bit lines;
  first and second column decoders, respectively, operatively connected to said pairs of bit lines;
  a writing-reading out bus operatively connected to said first column decoders; and
  a reading out bus operatively connected to said second column decoders.

8. A dual port type semiconductor memory including a dynamic random access memory as claimed in claim 7, further comprising:
  a first set of gates including two transistors, respectively, operatively connected to said pairs of bit lines, said writing-reading out bus and said first column decoders; and
  a second set of gates including four transistors, the gates of two of said four transistors respectively, operatively connected to said pairs of bit lines, the gates of the other two of said four transistors operatively connected to each other and respectively connected to said second column decoders, said other two of said four transistors also operatively connected to said reading out bus.

9. A dual port type semiconductor memory including a dynamic random access memory as set forth in claim 8, further comprising:
  a first column address bus operatively connected to said first column decoders; and
  a second column address bus operatively connected to said second column address decoders.

* * * * *

UNITED STATES PATENT AND TRADEMARK OFFICE
CERTIFICATE OF CORRECTION

PATENT NO. : 4,578,780
DATED : MARCH 25, 1986
INVENTOR(S) : FUMIO BABA

It is certified that error appears in the above-identified patent and that said Letters Patent is hereby corrected as shown below:

```
Col. 1, line 31, after "and" insert --therefore--;
        line 32, delete "therefore".

Col. 2, line 29                              "of" should be --at--;
        line 61, "cell" should be --cells--.

Col. 4, line 49, "part" should be --port--.
```

Signed and Sealed this

First Day of July 1986

[SEAL]

Attest:

Attesting Officer

DONALD J. QUIGG

Commissioner of Patents and Trademarks